United States Patent
Iikura et al.

(10) Patent No.: US 11,983,362 B2
(45) Date of Patent: May 14, 2024

(54) CAPACITANCE DETECTION DEVICE AND INPUT DEVICE

(71) Applicant: Alps Alpine Co., Ltd., Tokyo (JP)

(72) Inventors: Akihisa Iikura, Miyagi-ken (JP); Motoshi Oi, Miyagi-ken (JP); Tomoya Sasaki, Miyagi-ken (JP)

(73) Assignee: Alps Alpine Co., Ltd. (JP)

( * ) Notice: Subject to any disclaimer, the term of this patent is extended or adjusted under 35 U.S.C. 154(b) by 0 days.

(21) Appl. No.: 18/186,537

(22) Filed: Mar. 20, 2023

(65) Prior Publication Data

US 2023/0229261 A1 Jul. 20, 2023

Related U.S. Application Data

(63) Continuation of application No. PCT/JP2021/031977, filed on Aug. 31, 2021.

(30) Foreign Application Priority Data

Oct. 8, 2020 (JP) ................... 2020-170629

(51) Int. Cl.
*G06F 3/044* (2006.01)
*G06F 3/041* (2006.01)

(52) U.S. Cl.
CPC ........ *G06F 3/0418* (2013.01); *G06F 3/04164* (2019.05); *G06F 3/044* (2013.01); *G06F 2203/04107* (2013.01)

(58) Field of Classification Search
CPC .... G06F 3/04164; G06F 3/0418; G06F 3/044; G06F 2203/04107
See application file for complete search history.

(56) References Cited

U.S. PATENT DOCUMENTS

| 11,144,162 | B1* | 10/2021 | Tanaka | G06F 3/0412 |
| 2015/0035797 | A1* | 2/2015 | Shahparnia | G06F 3/03545 |
| | | | | 345/87 |
| 2017/0123523 | A1* | 5/2017 | Huang | G06F 3/0418 |
| 2018/0107335 | A1* | 4/2018 | Petrovic | G06F 3/044 |
| 2019/0294297 | A1 | 9/2019 | Sasai et al. | |

FOREIGN PATENT DOCUMENTS

| JP | H05-288790 A | 11/1993 |
| WO | 2018-116706 A1 | 6/2018 |

OTHER PUBLICATIONS

International Search Report issued in the corresponding International Application No. PCT/JP2021/031977; dated Oct. 19, 2021 (total 5 pages).

* cited by examiner

*Primary Examiner* — Sanghyuk Park
(74) *Attorney, Agent, or Firm* — Harness, Dickey & Pierce, P.L.C.

(57) ABSTRACT

A first detection signal creation unit has detection nodes connected to detection electrodes in one-to-one correspondence. The first detection signal creation unit supplies charge from each detection node through a second wire to the relevant detection electrode so that a voltage at the relevant detection node vibrates according to an alternating-current voltage, and creates first detection signals matching the supplied charge. First filters are provided in first paths, each of which branches from an alternating-current output node to a first wire. A phase difference signal creation unit creates a phase difference signal matching the phase difference between the alternating-current voltage and one of the first detection signals.

14 Claims, 6 Drawing Sheets

CAPACITANCE DETECTION DEVICE AND INPUT DEVICE

CLAIM OF PRIORITY

This application is a Continuation of International Application No. PCT/JP2021/031977 filed on Aug. 31, 2021, which claims benefit of Japanese Patent Application No. 2020-170629 filed on Oct. 8, 2020. The entire contents of each application noted above are hereby incorporated by reference.

BACKGROUND OF THE INVENTION

1. Field of the Invention

The present invention relates to a capacitance detection device and an input device.

2. Description of the Related Art

When a self-capacitance type of capacitive sensor detects capacitance between a detection electrode and a target such as a finger, parasitic capacitance between the detection electrode and an object other than the target causes error. In a known method of reducing this type of error, a shield electrode (also referred to as an active shield) that has the same potential as the detection electrode is placed in the vicinity of the detection electrode. In US2019/0294297A1, a technology is described that further reduces the influence of the parasitic capacitance described above in a capacitance detection device having a shield electrode. Japanese Unexamined Patent Application Publication No. 5-288790 is an example of related art.

When a wiring board on which electrodes for sensing (detection electrode and shield electrode) are provided and a wiring board on which an electronic circuit that detects a capacitance is provided are disposed at places distant from each other, these wiring boards need to be wired with a cable or the like, so a failure or malfunction due to a broken wire is likely to occur.

When a wire leading to the detection electrode is broken, a capacitance cannot be detected, so the occurrence of wire breakage can be easily determined. However, when part of a plurality of wires leading to shield electrodes is broken, the effect of external noise is likely to be received or noise is likely to be emitted to the circumference. In spite of this, electric continuity is maintained between the shield electrodes and the electronic circuit, so an abnormality is less likely to appear in the result of detection of a capacitance. This is disadvantage in that the occurrence of wire breakage cannot be easily determined from the capacitance detection result.

The present invention addresses the above situation by providing a capacitance detection device that can easily determine that part of a plurality of wires leading to shield electrodes has been broken and to provide an input device having this type of capacitance detection device.

SUMMARY OF THE INVENTION

A capacitance detection device in a first aspect of the present invention detects a capacitance between a target and a detection electrode placed close to a shield electrode. The capacitance detection device has: an alternating-current voltage output unit that outputs an alternating-current voltage to the shield electrodes through a plurality of first wires; a first detection signal creation unit that has a plurality of detection nodes connected to a plurality of detection electrodes in one-to-one correspondence through a plurality of second wires, each of which is placed close to one of the plurality of first wires, supplies charge from the detection node through the second wire to the detection electrode so that the voltage at the detection node vibrates according to the alternating-current voltage, and creates a plurality of first detection signals matching the charge supplied from the plurality of detection nodes; a plurality of first filters disposed in a plurality of first paths, each of which branches from an alternating-current output node, from which the alternating-current voltage output unit outputs the alternating-current voltage, to one of the plurality of first wires; and at least one phase difference signal creation unit that creates a phase difference signal matching the phase difference between the alternating-current voltage and one of the plurality of first detection signals.

In the capacitance detection device in the first aspect, the first filter is provided in each of the plurality of first paths, each of which branches from the alternating-current output node to one of the plurality of first wires. Therefore, if part of the plurality of first paths is broken, the number of first filters connected in parallel between the alternating-current output node and the shield electrode changes. Thus, the frequency response from the alternating-current output node to the shield electrode changes and the frequency response from the alternating-current output node to the output node of the first detection signal also changes. Therefore, the phase difference between the alternating-current voltage output from the alternating-current output node and an alternating-current component included in the first detection signal changes. Since the phase difference signal created by the phase difference signal creation unit matches the phase difference between one of the plurality of first detection signals and the alternating-current voltage, when part of the plurality of first wires is broken, the resulting change in the phase difference between the first detection signal and the alternating-current voltage can be easily determined according to a change in the phase difference signal.

The first filter is preferably a low-pass filter having a cutoff frequency higher than the frequency of the alternating-current voltage.

Thus, high-frequency external noise transmitted from the first wire can be attenuated in the first filter.

The capacitance detection device in the above first aspect preferably has a plurality of second filters disposed in a plurality of second paths between the plurality of second wires and the plurality of detection nodes. The second filter is preferably a low-pass filter having a cutoff frequency higher than the frequency of the alternating-current voltage.

Thus, high-frequency external noise transmitted from the second wire can be attenuated at the second filter.

The capacitance detection device in the above first aspect preferably has a sine wave generation unit that generates a sine wave signal, and also preferably has at least one second detection signal creation unit that creates a second detection signal matching the amplitude of an alternating-current component included in the first detection signal. The alternating-current voltage output unit preferably outputs the alternating-current voltage matching the sine wave signal. The second detection signal creation unit preferably includes a first multiplication unit that multiplies the sine wave signal and the first detection signal together, and also preferably includes a first low-pass filter that attenuates the high-frequency component of an output signal from the first multiplication unit. The phase difference signal creation unit preferably includes a first delay unit that delays the phase of the sine wave signal by 90 degrees, a second multiplication unit that multiplies the first detection signal and the sine wave signal delayed by the first delay unit together, and a second low-pass filter that attenuates the high-frequency component of an output signal from the second multiplication unit. The second detection signal creation unit preferably creates the second detection signal matching an output signal from the first low-pass filter. The phase difference signal creation unit preferably creates the phase difference signal matching an output signal from the second low-pass filter.

In this structure, when the phase difference between the sine wave signal and the alternating-current component included in the first detection signal is small, the phase difference signal matching the output signal from the second low-pass filter is such that the change ratio matching a change in the phase difference becomes large when compared with the second detection signal. Therefore, when part of the plurality of first wires is broken, the resulting change in the phase difference between the first detection signal and the alternating-current voltage can be easily determined according to a change in the phase difference signal.

In this structure, it becomes also possible to efficiently create both the second detection signal and the phase difference signal according to one sine wave signal.

The capacitance detection device in the above first aspect preferably has a second delay unit that delays the sine wave signal. The alternating-current voltage output unit preferably outputs the alternating-current voltage matching the sine wave signal delayed by the second delay unit. The amount of delay by the second delay unit has been preferably adjusted so that the output signal from the second low-pass filter is minimized.

In this structure, when the output signal from the second low-pass filter is minimized, the phase difference between the sine wave signal and the alternating-current component included in the first detection signal is near zero. Therefore, it becomes possible to increase detection sensitivity for a capacitance, the detection being by the second detection signal.

In this structure, it becomes also possible to make an adjustment to bring the phase difference between the sine wave signal and the alternating-current component included in the first detection signal close to zero by observing a change in the phase difference signal, the change matching a change in the amount of delay by the second delay unit.

The first detection signal creation unit preferably includes: at least one charge amplifier that supplies the charge to the detection node so that the voltage at the detection node vibrates according to the alternating-current voltage; at least one differential amplifier that outputs a signal matching the difference between the alternating-current voltage and an output signal from the charge amplifier; and at least one analog-to-digital conversion unit that converts an output signal from the differential amplifier to a digital signal and outputs the digital signal as the first detection signal.

In this structure, it becomes possible to create the first detection signal with a simple structure in which the charge amplifier, the differential amplifier, and the analog-to-digital conversion unit are used.

The alternating-current voltage output unit, the first detection signal creation unit, the second detection signal creation unit, the phase difference signal creation unit, and the sine wave generation unit are preferably provided in one or more integrated circuits. The first filter and the second filter are each composed of one or more parts different from the one or more integrated circuits.

Thus, it becomes possible to structure the first filter and second filter, each of which has a relatively large time constant and is difficult to implement in an integrated circuit, with the one or more parts.

The first filter preferably includes a first inductor disposed in the first path and two first capacitors, each of which is disposed between the ground and one of nodes at both ends of the first inductor. The second filter preferably includes a second inductor disposed in the second path and two second capacitors, each of which is disposed between the ground and one of nodes at both ends of the second inductor.

In this structure, in the first filter, it becomes easy to attenuate external noise from the same side as the first wire having a relatively high impedance, and in the second filter, it becomes easy to attenuate external noise from the same side as the second wire having a relatively high impedance.

The first filter preferably includes a first resistor disposed in the first path and two first capacitors, each of which is disposed between the ground and one of nodes at both ends of the first resistor. The second filter preferably includes a second resistor disposed in the second path and two second capacitors, each of which is disposed between the ground and one of nodes at both ends of the second resistor.

In this structure, in the first filter, it becomes easy to attenuate external noise from the same side as the first wire having a relatively high impedance, and in the second filter, it becomes easy to attenuate external noise from the same side as the second wire having a relatively high impedance.

The alternating-current voltage output unit, the first detection signal creation unit, the plurality of first filters, and the at least one phase difference signal creation unit are preferably disposed on a single first wiring board. The shield electrode and the plurality of detection electrodes are preferably disposed on one or more second wiring boards. The first wiring board and the one or more second wiring boards are preferably connected together through one or more wiring cables. The first wire and the second wire are preferably included in the wiring cable.

In this structure, when part of the plurality of first wires is broken in the one or more wiring cables, the resulting change in the phase difference between the first detection signal and the alternating-current voltage can be easily determined according to a change in the phase difference signal.

The alternating-current voltage output unit preferably outputs the alternating-current voltage in which a direct-current voltage having an amplitude larger than a half of the amplitude of the alternating-current voltage is superimposed.

Thus, it becomes possible to operate, with a single power source, a circuit that outputs the alternating-current voltage.

An input device in a second aspects of the present invention accepts information matching the approach of a target. The input device has: a plurality of detection electrodes, a capacitance between the target and the plurality of detection electrodes changing according to the approach of the target; a shield electrode placed close to the plurality of detection electrodes; and the capacitance detection device, in the above first aspect, that detects the capacitance between the target and each of the plurality of detection electrodes.

According to the present invention, it is possible to provide a capacitance detection device that can easily determine that part of a plurality of wires leading to shield electrodes has been broken and to provide an input device having this type of capacitance detection device.

DESCRIPTION OF THE PREFERRED EMBODIMENTS

Figure 1:
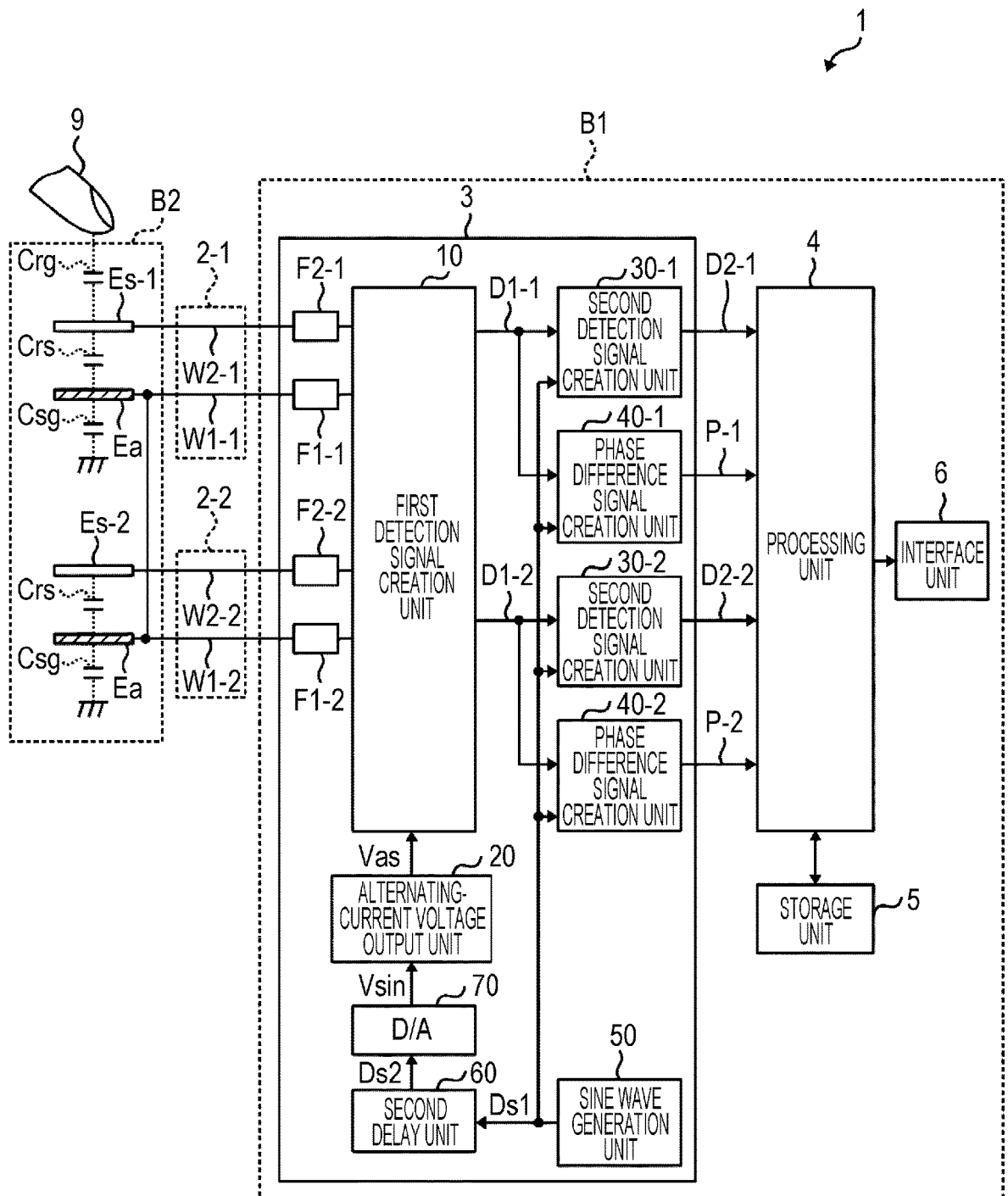
FIG. 1 illustrates an example of the structure of an input device according to this embodiment.

FIG. 1 illustrates an example of the structure of an input device according to this embodiment. The input device 1 illustrated in FIG. 1 has two detection electrodes Es-1 and Es-2, shield electrodes Ea placed close to the detection electrodes Es-1 and Es-2, a capacitance detection device 3, a processing unit 4, a storage unit 5, and an interface unit 6.

The input device 1 according to this embodiment detects, when a target 9 such as a finger or a pen approaches a detection electrode Es-i (i indicates an integer of 1 or 2), a capacitance between the detection electrode Es-i and the target 9, and accepts information matching the approach of the target 9 according to this detection result. For example, the input device 1 acquires information as to whether the target 9 approaches the detection electrode Es-i and information about the distance between the detection electrode Es-i and the target 9, according to the result of detection of the capacitance. The input device 1 is applied to, for example, a user interface device such as a touch sensor or a touch pad. The term "approach" and other similar terms in this description refer to closeness and do not impose any restriction on the presence or absence of a contact between objects that approach each other.

The detection electrode Es-i generates a capacitance between the detection electrode Es-i and the target 9 such a finger or pen, which is a conductor. The shield electrode Ea is placed close to the detection electrode Es-i. The detection electrode Es-i is placed in a detection area in which the target 9 such as a finger can approach the detection electrode Es-i. The front surface of the detection area is covered with, for example, an insulative cover layer. The detection electrode Es-i is placed on a lower layer side below the cover layer. The shield electrode Ea is an electrostatic shield used to prevent capacitive coupling between the detection electrode Es-i and an object other than the target 9. In the detection area, the shield electrode Ea is placed on a lower layer side below the detection electrode Es-i, for example.

As illustrated in FIG. 1, a capacitive component Crg, which is parasitic, is formed between the detection electrode Es-i and the target 9; capacitive component Crs, which is parasitic, is formed between the shield electrode Ea and the detection electrode Es-i, and a capacitive component Csg, which is parasitic, is formed between the shield electrode Ea and the ground.

The capacitance detection device 3 detects the capacitance of the capacitive component Crg formed between the target 9 and each of the detection electrodes Es-1 and Es-2 (in the description below, the capacitance may be written as the capacitance Crg eligible for detection), and outputs second detection signal D2-1 and D2-2 indicating the results of the detection.

The capacitance detection device 3 creates a phase difference signal P-1 matching the phase difference between a first detection signal D1-1 and an alternating-current voltage Vas, and also creates a phase difference signal P-2 matching the phase difference between a first detection signal D1-2 and the alternating-current voltage Vas, as described later.

The capacitance detection device 3 is connected to the detection electrode Es-1 and one shield electrode Ea through a cable 2-1 and is also connected to the detection electrode Es-2 and another shield electrode Ea through a cable 2-2, as illustrated in FIG. 1. In the cable 2-1, a first wire W1-1 leading to the one shield electrode Ea and a second wire W2-1 leading to the detection electrode Es-1 are placed close to each other. In the cable 2-2, a first wire W1-2 leading to the other shield electrode Ea and a second wire W2-2 leading to the detection electrode Es-2 are placed close to each other. In the description below, the first wires W1-1 and W1-2 may be referred to as the first wire W1 without distinguishing between them.

The processing unit 4 is a circuit that controls overall operations of the input device 1. For example, the processing unit 4 includes one or more processors (central processing unit (CPU), digital signal processor (DSP), and the like) that perform processing according to operation code of programs stored in the storage unit 5. The processing unit 4 may also include special hardware (application-specific integrated circuit (ASIC), field-programmable gate array (FPGA), and the like) structured so as to fulfill particular functions. Processing by the processing unit 4 may be implemented by execution of operation code by processors or at least part of processing may be implemented by special hardware.

According to the second detection signals D2-1 and D2-2 output from the capacitance detection device 3, the processing unit 4 decides whether the target 9 is in proximity to the detection electrode Es-1 or Es-2, calculates the distance between the target 9 and the detection electrode Es-i, calculates the proximity distance of the target 9 in the detection area, calculates the size of the target 9, and performs other processing.

The processing unit 4 also performs processing to decide whether part of the plurality of first wires W1 leading to the shield electrodes Ea has been broken, according to a phase difference signal P-i output from the capacitance detection device 3.

The storage unit 5 stores programs including operation code executed by the processor in the processing unit 4, data used in processing in the processing unit 4, data temporarily held in a processing process, and the like. The storage unit 5 is structured by using one or more types of storage devices such as, for example, a dynamic random access memory (DRAM), a static random access memory (SRAM), a flash memory, and a hard disk drive.

The interface unit 6 is a circuit used to transmit and receive data between the input device 1 and another device (a host controller of an electronic unit having the input device 1, for example). The processing unit 4 outputs information (the presence or absence of the target 9, the proximity position of the target 9, the distance to the target 9, the size of the target 9, and the like) obtained according to the detection result from the capacitance detection device 3 to a high-end device (not illustrated) through the interface unit 6.

In the example in FIG. 1, the capacitance detection device 3, processing unit 4, storage unit 5, and interface unit 6 may be provided on a first wiring board B1; and the detection electrodes Es-1 and Es-2 and shield electrodes Ea may be provided on a second wiring board B2. The first wiring board B1 and second wiring board B2 may be connected together through the cables 2-1 and 2-2.

Figure 2:
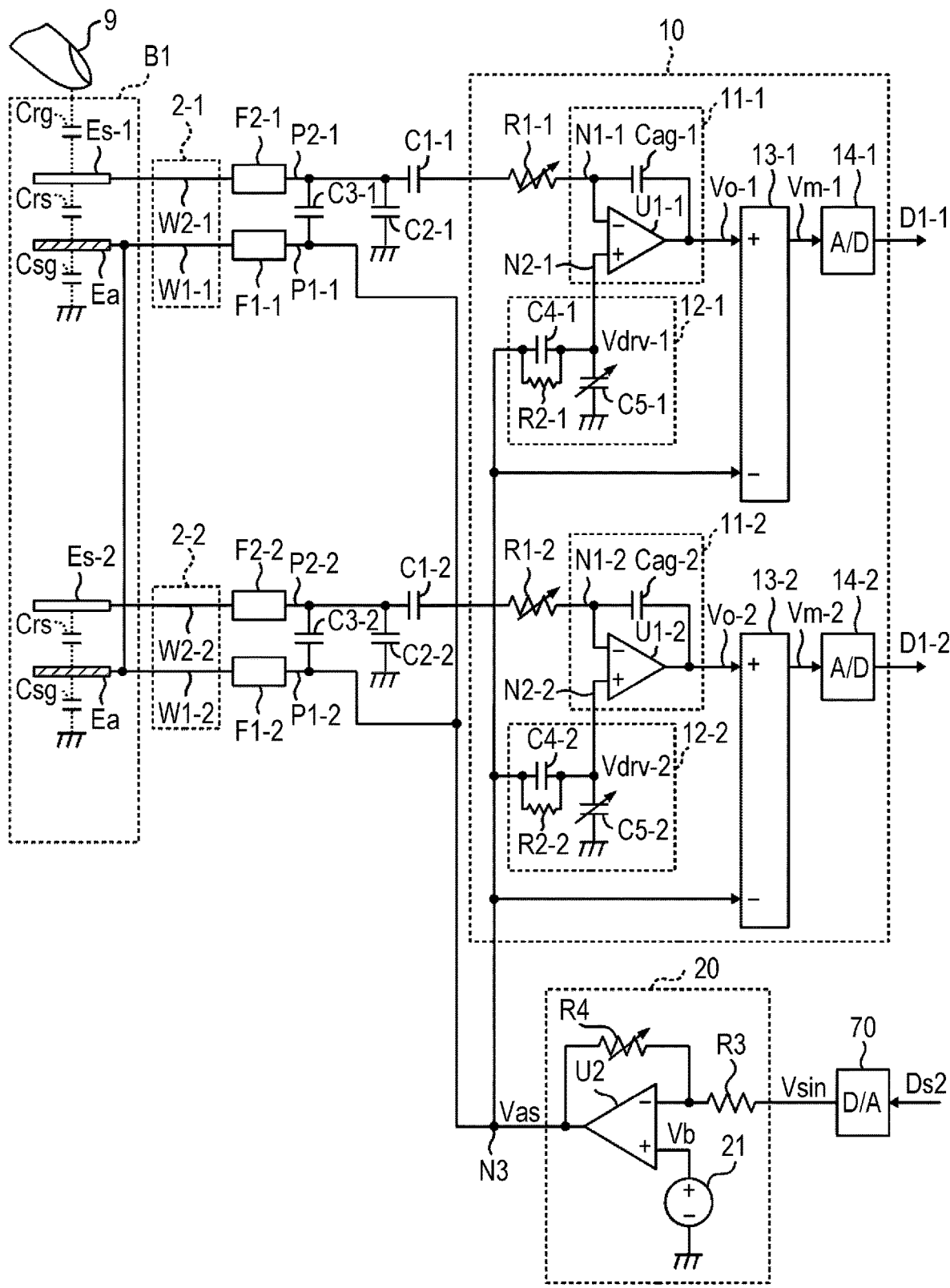
FIG. 2 illustrates an example of the structure of a capacitance detection device according to this embodiment.

Next, the structure of the capacitance detection device 3 will be described. FIG. 2 illustrates an example of the structure of the capacitance detection device 3 according to this embodiment.

In the examples in FIGS. 1 and 2, the capacitance detection device 3 has a first detection signal creation unit 10, an alternating-current voltage output unit 20, second detection signal creation units 30-1 and 30-2, phase difference signal creation units 40-1 and 40-2, a sine wave generation unit 50, a second delay unit 60, a digital-to-analog (D/A) conversion unit 70, first filters F1-1 and F1-2, and second filters F2-1 and F2-2.

In the example in FIG. 2, the capacitance detection device 3 also has capacitors C1-1 and C1-2, capacitors C2-1 and C2-2, and capacitors C3-1 and C3-2.

First Detection Signal Creation Unit 10

The first detection signal creation unit 10 has two detection nodes N1-1 and N1-2, which are connected to two detection electrodes Es in one-to-one correspondence through two second wires W2, as illustrated in FIG. 2. A detection node N1-$i$ is connected to the detection electrode Es-$i$ through a second wire W2-$i$.

The first detection signal creation unit 10 supplies charge from the detection node N1-$i$ through the second wire W2-$i$ to the detection electrode Es-$i$ so that the voltage at the detection node N1-$i$ vibrates according to the alternating-current voltage Vas output from the alternating-current voltage output unit 20.

The first detection signal creation unit 10 creates two first detection signals D1-1 and D1-2 that match charge supplied respectively from the detection nodes N1-1 and N1-2. That is, the first detection signal creation unit 10 creates a first detection signal D1-$i$ that matches charge supplied from the detection node N1-$i$ to the detection electrode Es-$i$.

In the example in FIG. 2, the first detection signal creation unit 10 may have charge amplifiers 11-1 and 11-2, attenuation circuits 12-1 and 12-2, differential amplifiers 13-1 and 13-2, analog-to-digital (A/D) conversion units 14-1 and 14-2, and resistors R1-1 and R1-2.

An attenuation circuit 12-$i$ attenuates the amplitude of the alternating-current voltage Vas output from the alternating-current voltage output unit 20, and then outputs the resulting signal as an alternating-current voltage Vdrv-$i$. The attenuation circuit 12-$i$ holds an attenuation ratio K, which is the ratio of the amplitude of the alternating-current voltage Vdrv-$i$ to the amplitude of the alternating-current voltage Vas, to a ratio at which the voltage amplitude of an output signal Vo-$i$ from a charge amplifier 11-$i$ becomes near zero in a non-detected state in which the target 9 is not present.

In the example in FIG. 2, the attenuation circuit 12-$i$ includes a capacitor C4-$i$ and a capacitor C5-$i$, which are connected to each other in series. The alternating-current voltage output unit 20 applies the alternating-current voltage Vas to a series circuit composed of the capacitor C4-$i$ and capacitor C5-$i$. One terminal of the capacitor C4-$i$ is connected to an alternating-current output node N3, from which the alternating-current voltage Vas of the alternating-current voltage output unit 20 is output. The other terminal of the capacitor C4-$i$ is connected to the ground through the capacitor C5-$i$. The attenuation circuit 12-$i$ outputs an alternating-current voltage generated in the capacitor C5-$i$ as the alternating-current voltage Vdrv-$i$. The capacitor C4-$i$ and capacitor C5-$i$ each have a capacitance that is set so that the voltage amplitude of the output signal Vo-$i$ from the charge amplifier 11-$i$ becomes near zero in the non-detected state in which the target 9 is not present.

In the example in FIG. 2, the capacitance value of the capacitor C5-$i$, the value being adjustable, is adjusted so that the voltage amplitude of the output signal Vo-$i$ from the charge amplifier 11-$i$ becomes near zero in the non-detected state in which the target 9 is not present. The capacitor C5-$i$ may be a part formed on a semiconductor chip or the like in an integrated circuit (IC). In this case, the capacitor C5-$i$ is structured by a plurality of capacitors connected in parallel, and the capacitance value is adjusted by selecting the number of capacitors to be connected in parallel through laser trimming or the like. Also, the capacitor C5-$i$ may be a discrete part the element value of which is adjustable.

An alternating-current input node N2-$i$, to which the capacitor C4-$i$ and capacitor C5-$i$ are connected, is connected to the alternating-current output node N3 through a resistor R2-$i$. The input (the non-inverting input terminal of an operational amplifier U1-$i$ described later) of the charge amplifier 11-$i$, to which the alternating-current input node N2-$i$ is connected, has a sufficiently large input impedance when compared with the resistor R2-$i$, so the direct-current potential at the alternating-current input node N2-$i$ is substantially the same as the direct-current potential at the alternating-current output node N3. In the example in FIG. 2, the resistance value of the resistor R2-$i$ can be adjusted during manufacturing. When this resistance value is adjusted, therefore, the phase of the alternating-current voltage Vdrv-$i$ can be adjusted with respect to the phase of the alternating-current voltage Vas.

The charge amplifier 11-$i$ may supply charge to the detection node N1-$i$ so that the voltage at the detection node N1-$i$ vibrates according to the alternating-current voltage Vas, and may output the output signal Vo-$i$ matching the supplied charge. At the alternating-current input node N2-$i$, the charge amplifier 11-$i$ accepts the alternating-current voltage Vdrv-$i$ resulting from attenuating the amplitude of the alternating-current voltage Vas. The charge amplifier 11-$i$ then supplies charge to the detection node N1-$i$ so that the voltage at the detection node N1-$i$ approaches the voltage at the alternating-current input node N2-$i$ (that is, so that the alternating-current voltage Vdrv-$i$ is generated at the detection node N1-$i$).

In the example in FIG. 2, the charge amplifier 11-$i$ has a feedback capacitor Cag and the operational amplifier U1-$i$. The operational amplifier U1-$i$ amplifiers the difference in voltage between the inverting input terminal connected to the detection node N1-$i$ and the non-inverting input terminal connected to the alternating-current input node N2-$i$, and outputs the output signal Vo-$i$ matching the amplified difference in voltage. The feedback capacitor Cag is disposed in the path between the detection node N1-$i$ and the output node of the operational amplifier U1-$i$, which outputs the output signal Vo-$i$.

A differential amplifier 13-$i$ may output a signal Vm-$i$ matching the difference between the alternating-current voltage Vas and the output signal Vo-$i$ from the charge amplifier 11-$i$. The differential amplifier 13-$i$, which includes, for example, a fully-differential amplifier, outputs the signal Vm-$i$ as a differential signal. The differential amplifier 13-$i$ also has a function as a low-pass filter, which attenuates frequency components having frequencies higher than a predetermined frequency band, to suppress aliasing, which accompanies a conversion operation by the A/D conversion unit 14-$i$ disposed at a later stage.

The A/D conversion unit 14-$i$ may convert the signal Vm-i output from the differential amplifier 13-$i$ to the first detection signal D1-$i$, which is a digital signal.

The resistor R1-$i$ is disposed in a second path P2-$i$, which is a conductive path between the detection node N1-$i$ and the second wire W2-$i$.

Alternating-Current Voltage Output Unit 20

The alternating-current voltage output unit 20 outputs the alternating-current voltage Vas to the shield electrodes Ea through a plurality of first wires W1. For example, the alternating-current voltage output unit 20 may output a sine wave alternating-current voltage Vas having a constant amplitude and a constant frequency.

In the example in FIG. 2, the alternating-current voltage output unit 20 includes a constant-voltage source 21, which outputs a direct-current voltage, an operational amplifier U2, and resistors R3 and R4. A direct-current voltage Vb of the constant-voltage source 21 is applied to the non-inverting input terminal of the operational amplifier U2. A signal Vsin with a sine wave is input to the inverting input terminal of the operational amplifier U2 through the resistor R3. The resistor R4 is disposed in the path between the output terminal and non-inverting input terminal of the operational amplifier U2. The output terminal of the operational amplifier U2 is connected to the alternating-current output node N3. The operational amplifier U2 outputs, from the output terminal to the alternating-current output node N3, the alternating-current voltage Vas in which the direct-current voltage Vb of the constant-voltage source 21 has been superimposed. Since the amplitude of the direct-current voltage Vb is larger than a half of the amplitude of the alternating-current voltage Vas, the alternating-current voltage Vas is always a positive voltage. In the example in FIG. 2, the resistance value of the resistor R4, which is adjustable, is adjusted so that the alternating-current voltage Vas has a predetermined amplitude.

First Filter F1-$i$ and Second Filter F2-$i$

The first filter F1-1 is disposed in a first path P1-1, which is a conductive path branching from the alternating-current output node N3 to one of the two first wires W1. The first filter F1-2 is disposed in a first path P1-2, which is a conductive path branching from the alternating-current output node N3 to the other of the two first wires W1. That is, the first filter F1-$i$ is disposed in a first path P1-$i$, through which the alternating-current output node N3 branches to a first wire W1-$i$.

The second filter F2-1 may be disposed in a second path P2-1, which is a conductive path between the second wire W2-1 and the detection node N1-1. The second filter F2-2 may be disposed in a second path P2-2, which is a conductive path between the second wire W2-2 and the detection node N1-2. That is, the second filter F2-$i$ is disposed in a second path P2-$i$ between the second wire W2-$i$ and the detection node N1-$i$.

The first filter F1-$i$ and second filter F2-$i$ may be each, for example, a low-pass filter having a cutoff frequency higher than the frequency of the alternating-current voltage Vas. These filters attenuate external noise transmitted from the first wire W1-$i$ or second wire W2-$i$ to the capacitance detection device 3, and also attenuate noise emitted from the capacitance detection device 3 through the first wire W1-$i$ or second wire W2-$i$ to the circumference.

Figure 3A:
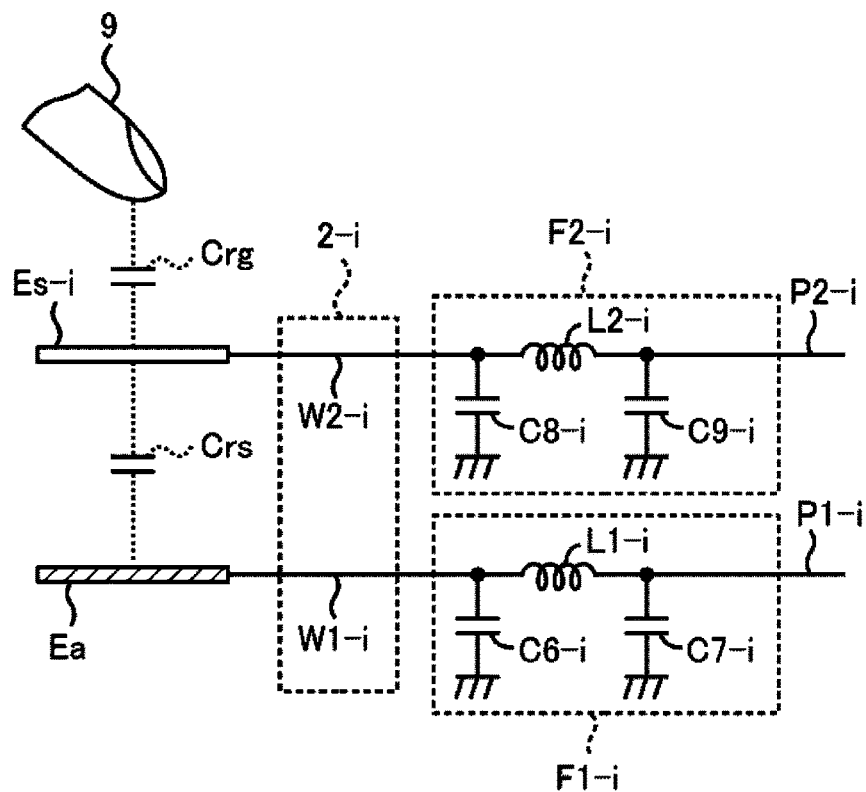
FIGS. 3A and 3B illustrate the structures of a first filter and second filter.

FIG. 3A illustrates the structures of the first filter F1-$i$ and second filter F2-$i$. In the example in FIG. 3A, the first filter F1-$i$ and second filter F2-$i$ are each a low-pass filter in which an inductor and capacitors are connected in a π form.

The first filter F1-$i$ illustrated in FIG. 3A may have a first inductor L1-$i$ disposed in the first path P1-$i$, and also may have a first capacitor C6-$i$ and a first capacitor C7-$i$, each of which is disposed between the ground and one of nodes at both ends of the first inductor L1-$i$. The first capacitor C6-$i$ is connected to one of the terminals of the first inductor L1-$i$, the one of the terminals being on the same side as the first wire W1-$i$. The first capacitor C7-$i$ is connected to the other of the terminals of the first inductor L1-$i$.

The second filter F2-$i$ illustrated in FIG. 3A may have a second inductor L2-$i$ disposed in the second path P2-$i$, and also may have a second capacitor C8-$i$ and a second capacitor C9-$i$, each of which is disposed between the ground and one of nodes at both ends of the second inductor L2-$i$. The second capacitor C8-$i$ is connected to one of the terminals of the second inductor L2-$i$, the one of the terminals being on the same side as the second wire W2-$i$. The second capacitor C9-$i$ is connected to the other of the terminals of the second inductor L2-$i$.

Figure 3B:
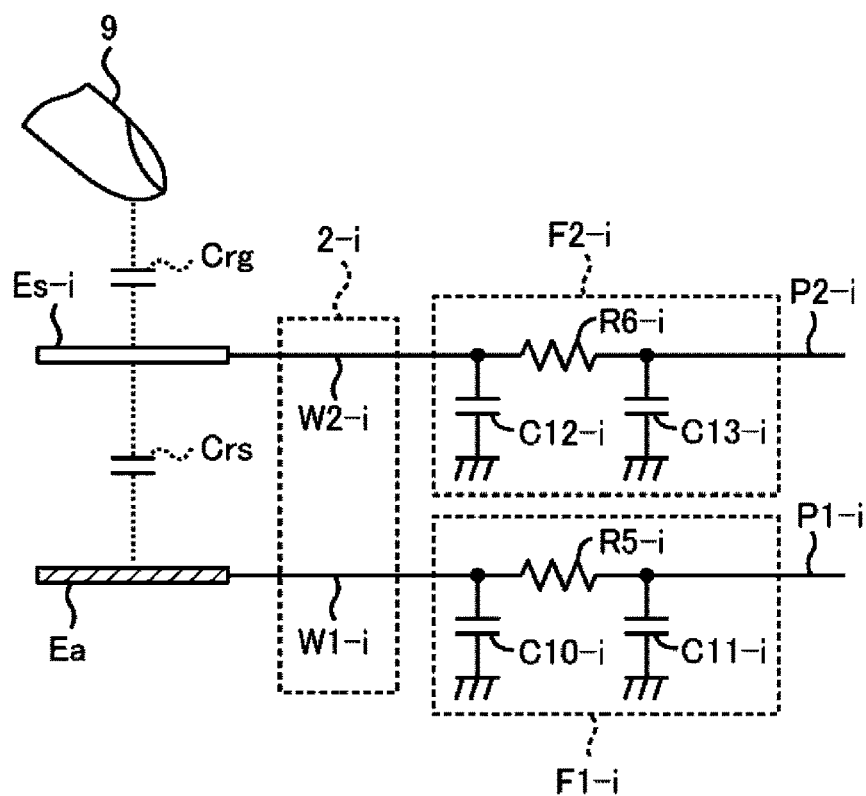

FIG. 3B illustrates other structures of the first filter F1-$i$ and second filter F2-$i$. In the example in FIG. 3B, the first filter F1-$i$ and second filter F2-$i$ are each a low-pass filter in which a resistor and capacitors are connected in a π form.

The first filter F1-$i$ illustrated in FIG. 3B may have a first resistor R5-$i$ disposed in the first path P1-$i$, and also may have a first capacitor C10-$i$ and a first capacitor C11-$i$, each of which is disposed between the ground and one of nodes at both ends of the first resistor R5-$i$. The first capacitor C10-$i$ is connected to one of the terminals of the first resistor R5-$i$, the one of the terminals being on the same side as the first wire W1-$i$. The first capacitor C11-$i$ is connected to the other of the terminals of the first resistor R5-$i$.

The second filter F2-$i$ illustrated in FIG. 3B has a second resistor R6-$i$ disposed in the second path P2-$i$, and also has a second capacitor C12-$i$ and a second capacitor C13-$i$, each of which is disposed between the ground and one of nodes at both ends of the second resistor R6-$i$. The second capacitor C12-$i$ is connected to one of the terminals of the second resistor R6-$i$, the one of the terminals being on the same side as the second wire W2-$i$. The second capacitor C13-$i$ is connected to the other of the terminals of the second resistor R6-$i$.

Capacitors C1-$i$, C2-$i$, and C3-$i$

The capacitor C1-$i$ is disposed between the resistor R1-$i$ and the second filter F2-$i$ in the second path P2-$i$. The capacitor C2-$i$ is disposed between the ground and the terminal of the capacitor C1-$i$ on the same side as the second filter F2-$i$. Due to the capacitor C1-$i$ and capacitor C2-$i$, it is possible to suppress an increase in charge in the charge amplifier 11-$i$, the increase being attributable to a large capacitance of the capacitive component Crs, and thereby to suppress detection sensitivity so as to fall into an appropriate range.

The capacitor C3-$i$ is disposed between the alternating-current output node N3 and the terminal of the capacitor C1-$i$ on same side as the second filter F2-$i$. Due to the capacitor C3-$i$, it is possible to reduce external noise transmitted from the first wire W1-$i$ or second wire W2-$i$ to the capacitance detection device 3.

Sine Wave Generation Unit 50

The sine wave generation unit 50 may generate a sine wave signal Ds1 used as a reference of the alternating-current voltage Vas. The sine wave generation unit 50 generates the sine wave signal Ds1 by, for example, reading numeric data of a sine wave from a memory in succession at predetermined timings.

Second Detection Signal Creation Unit 30-$i$

The second detection signal creation unit 30-$i$ may create a second detection signal D2-$i$ matching the amplitude of an alternating-current component (component in synchronism with the alternating-current voltage Vas) included in the first detection signal D1-$i$. The second detection signal D2-$i$ is an in-phase response. Since the alternating-current component included in the first detection signal D1-$i$, the alternating-current component being in synchronization with the alternating-current voltage Vas, has an amplitude matching the capacitance Crg eligible for detection, the first detection signal D1-$i$ has a value matching the capacitance Crg eligible for detection.

Figure 4:
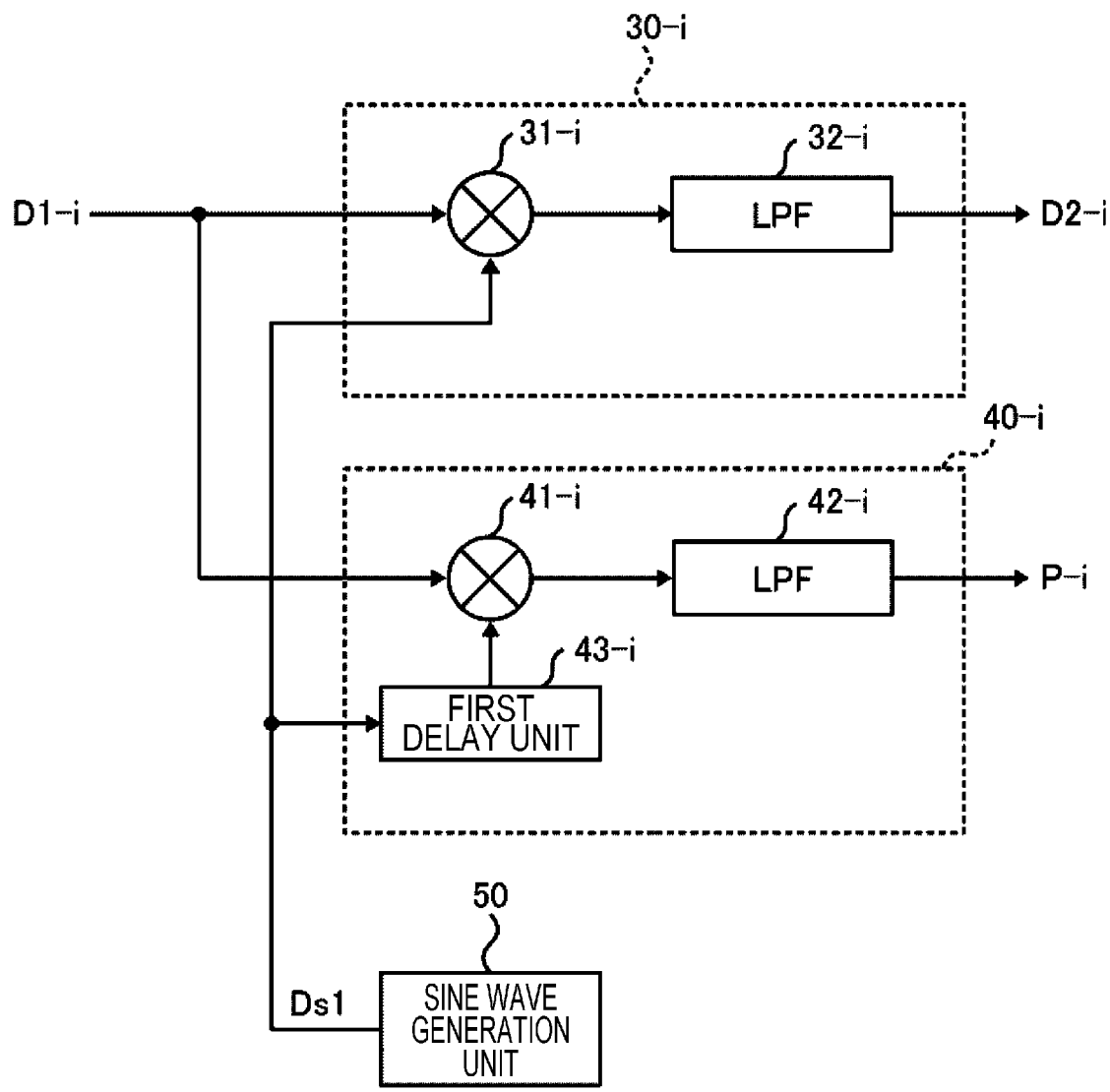
FIG. 4 illustrates examples of the structures of a second detection signal creation unit and phase difference signal creation unit.

The second detection signal creation unit 30-$i$ may have a first multiplication unit 31-$i$ and a first low-pass filter 32-$i$ as illustrated in, for example, FIG. 4. The first multiplication unit 31-$i$ may multiply the sine wave signal Ds1 and first detection signal D1-$i$ together. The first low-pass filter 32-$i$ may attenuate the high-frequency component of an output signal from the first multiplication unit 31-$i$, and then may output the resulting signal as the second detection signal D2-$i$.

Phase Difference Signal Creation Unit 40-$i$

A phase difference signal creation unit 40-$i$ creates the phase difference signal P-i matching the phase difference between the first detection signal D1-$i$ and the alternating-current voltage Vas.

The phase difference signal creation unit 40-$i$ may have a second multiplication unit 41-$i$, a second low-pass filter 42-$i$, and a first delay unit 43-$i$, as illustrated in, for example, FIG. 4.

The first delay unit 43-$i$ may delay the phase of the sine wave signal Ds1 by 90 degrees. The second multiplication unit 41-$i$ may multiply the first detection signal D1-$i$ and the sine wave signal Ds1 delayed by the first delay unit 43-$i$ together. The second low-pass filter 42-$i$ may attenuate the high-frequency component of an output signal from the second multiplication unit 41-$i$, and then may output the resulting signal as the phase difference signal P-i. The phase difference signal P-i is a quadrature-phase response. When the phase difference between the first detection signal D1-$i$ and the alternating-current voltage Vas is near zero, the phase difference signal P-i takes a value of near zero.

The phase difference signal creation unit 40-$i$ may create the phase difference signal P-i matching the phase difference between the first detection signal D1-$i$ and the alternating-current voltage Vas according to an output signal from the first low-pass filter 32-$i$ and an output signal from the second low-pass filter 42-$i$. For example, the sine value of a complex vector the real part of which is the output signal from the first low-pass filter 32-$i$ and the imaginary part of which is the output signal from the second low-pass filter 42-$i$ may be calculated as the phase difference signal P-i. When the phase difference between the first detection signal D1-$i$ and the alternating-current voltage Vas is near zero, the phase difference signal P-i calculated like this also takes a value of near zero.

Second Delay Unit 60 and D/A Conversion Unit 70

The second delay unit 60 creates a sine wave signal Ds2 by delaying the sine wave signal Ds1 created by the sine wave generation unit 50. The D/A conversion unit 70 converts the sine wave signal Ds2 in a digital form to a sine wave signal Vsin in an analog form, and inputs the sine wave signal Vsin to the alternating-current voltage output unit 20.

The alternating-current voltage output unit 20 creates the alternating-current voltage Vas according to the sine wave signal Vsin resulting from delaying the sine wave signal Ds1 and then converting the delayed signal to an analog form.

The amount of delay by the second delay unit 60 may have been adjusted so that the output signal from the second low-pass filter 42-$i$ in the phase difference signal creation unit 40-$i$ is minimized. When the output signal from the second low-pass filter 42-$i$ is minimized, the phase difference between the sine wave signal Ds1 and the alternating-current component included in the first detection signal D1-$i$ is near zero. Therefore, detection sensitivity for the capacitance Crg eligible for detection by the second detection signal D2-$i$ becomes high.

The capacitance detection device 3 is composed of, for example, one or more integrated circuits (ICs) and one or more parts (discrete parts) different from integrated circuits. For example, in the structure described above includes, the first detection signal creation unit 10, alternating-current voltage output unit 20, second detection signal creation units 30-1 and 30-2, phase difference signal creation units 40-1 and 40-2, sine wave generation unit 50, second delay unit 60, and D/A conversion unit 70 may be provided in one or more integrated circuits. The first filter F1-$i$, second filter F2-$i$, capacitor C1-$i$, capacitor C2-$i$, and capacitor C3-$i$ are composed of parts (discrete parts) different from integrated circuits.

Next, the operation of the capacitance detection device 3 in the input device 1 structured as described above will be described.

In a normal operation in which there is no wire breakage, the charge amplifier 11-$i$ in the first detection signal creation unit 10 supplies charge to the detection node N1-$i$ so that an alternating-current voltage substantially the same as the alternating-current voltage Vdrv-i resulting from attenuation of the amplitude of the alternating-current voltage Vas by the attenuation circuit 12-$i$ is generated at the detection node N1-$i$. Since this charge is supplied from the detection node N1-$i$ through the second wire W2-$i$ to the detection electrode Es-i, the amplitude of variations of charge matching the alternating-current voltage Vdrv-i changes according to capacitance Crg eligible for detection. Therefore, the amplitude of the output signal Vo-i from the charge amplifier 11-$i$ changes according to the capacitance Crg eligible for detection, and the amplitude of the first detection signal D1-$i$ also changes according to the capacitance Crg eligible for detection, the first detection signal D1-$i$ resulting from amplifying the difference between the alternating-current voltage Vas and the output signal Vo-i from the charge amplifier 11-$i$ and then converting the resulting signal to a digital form. Since the second detection signal creation unit 30-$i$ creates the second detection signal D2-$i$ matching the amplitude of the alternating-current component (component in synchronism with the alternating-current voltage Vas) included in the first detection signal D1-$i$, the value of the second detection signal D2-$i$ changes according to the capacitance Crg eligible for detection. Thus, when the target 9 approaches the detection electrode Es-i, the resulting change in the capacitance Crg eligible for detection can be detected as a change in the second detection signal D2-$i$.

When there is no wire breakage, the phase difference between the sine wave signal Ds1 and the alternating-current component (component in synchronism with the alternating-current voltage Vas) included in the first detection signal D1-$i$ is small. Therefore, the phase difference signal P-i created by the phase difference signal creation unit 40-$i$ takes a value of near zero.

Figure 5:
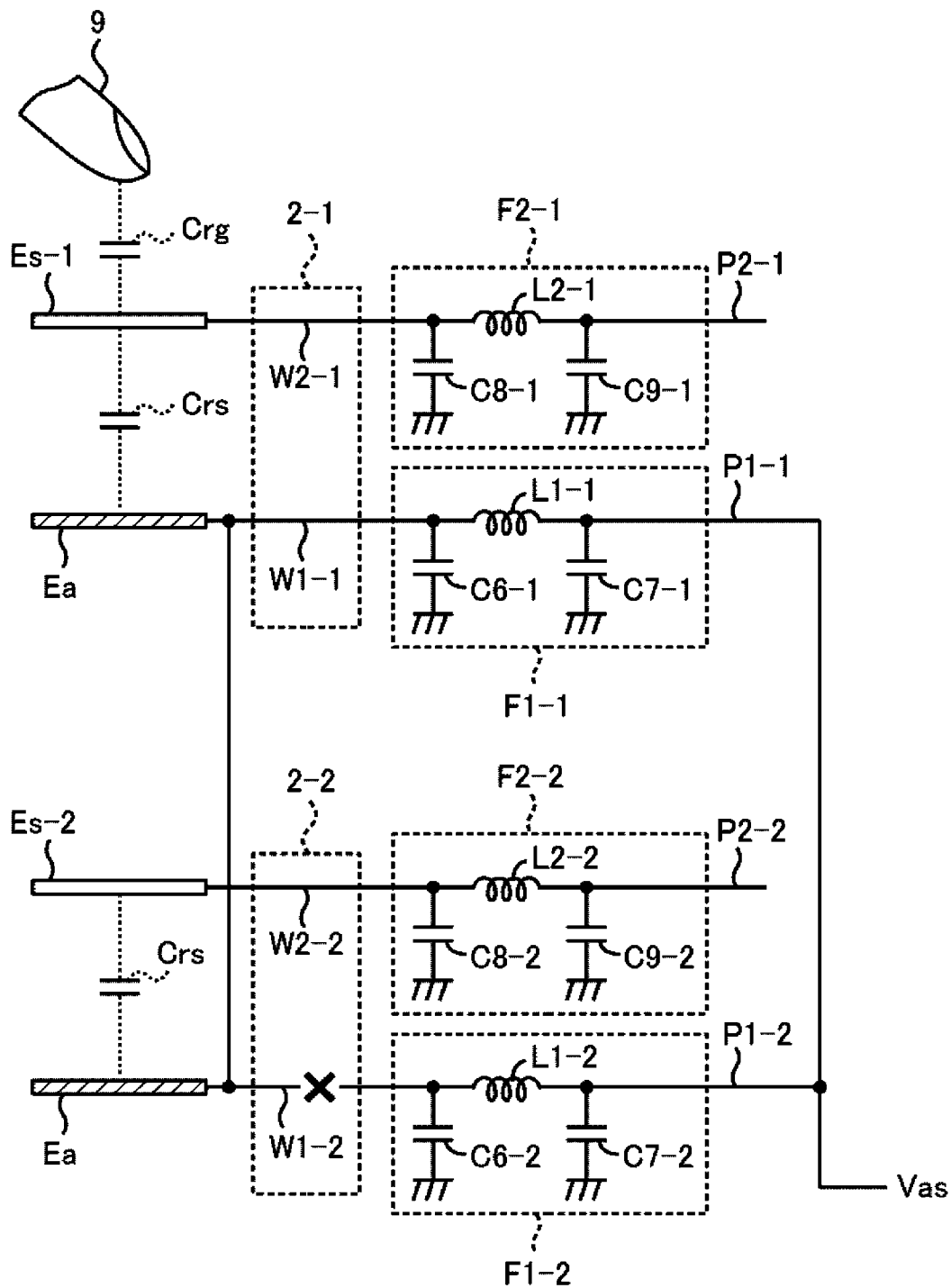
FIG. 5 illustrates a state in which part of a plurality of first wires leading to shield electrodes is broken.

It will be assumed here that part of a plurality of first wires W1 (in the example in FIG. 5, the part is the first wire W1-2) has been broken as illustrated in, for example, FIG. 5. In this case, the number of first filters F1-1 and F1-2 connected in parallel between the alternating-current output node N3 and the shield electrodes Ea is reduced. When the first filter F1-*i* is a low-pass filter in a π form as illustrated in FIGS. 3A and 3B, the apparent capacitance of the first filter F1-*i* leading to the first wire W1 that has caused breakage becomes large between the alternating-current output node N3 and the ground. Therefore, the frequency response from the alternating-current output node N3 to the shield electrode Ea changes and the frequency response from the alternating-current output node N3 to the output node of the first detection signal D1-*i* also changes. Therefore, the phase difference between the alternating-current voltage Vas output at the alternating-current output node N3 and the alternating-current component included in the first detection signal D1-*i* changes. Specifically, since the cutoff frequency, which is a low-pass filter property from the alternating-current output node N3 to the output node of the first detection signal D1-*i* is lowered, the phase of the alternating-current component included in the first detection signal D1-*i* is delayed with respect to the phase of the sine wave signal Ds1. Due to a change in this phase difference, the phase difference signal P-i created by the phase difference signal creation unit 40-*i* also changes. Therefore, it is possible to detect wire breakage caused in part of a plurality of first wires W1, according to the change in the phase difference signal P-i.

When the phase difference between the sine wave signal Ds1 and the alternating-current component included in the first detection signal D1-*i* is minute, the second detection signal D2-*i* created by the second detection signal creation unit 30-*i* according to the result of the multiplication of the first detection signal D1-*i* and Ds1 is such that the change ratio for the phase difference is near zero. Therefore, it is difficult to detect this phase difference according to the second detection signal D2-*i*. In contrast to this, the phase difference signal P-i created by the phase difference signal creation unit 40-*i* according to the result of multiplication of the first detection signal D1-*i* and a signal resulting from delaying the sine wave signal Ds1 by 90 degrees is such that the change ratio for the phase difference is the largest. Therefore, since the phase difference signal P-i also largely changes according to the change in the phase difference, the breakage of the first wire W1 can be easily determined from a change in the phase difference signal P-i.

This embodiment is not limited to the examples described above, but includes various variations.

Figure 6:
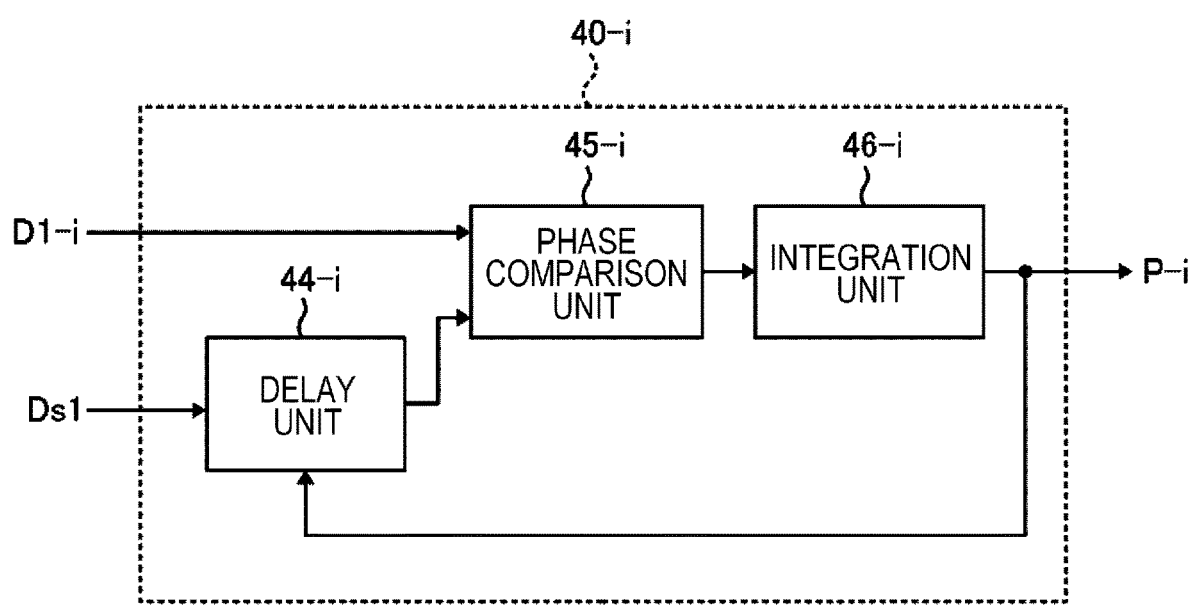
FIG. 6 illustrates a variation of the phase difference signal creation unit.

FIG. 6 illustrates a variation of the phase difference signal creation unit 40-*i*. The phase difference signal creation unit 40-*i* illustrated in FIG. 6 has a delay unit 44-*i* that delays the sine wave signal Ds1 according to a control signal entered into the delay unit 44-*i*, a phase comparison unit 45-*i* that makes a comparison between the phase of the first detection signal D1-*i* and the phase of the output signal from the delay unit 44-*i*, and an integration unit 46-*i* that integrates a signal matching the phase comparison result of the phase comparison unit 45-*i* and outputs the resulting signal as the phase difference signal P-i. The delay unit 44-*i* accepts the phase difference signal P-i output from the integration unit 46-*i* as a control signal, and controls the amount of delay of the sine wave signal Ds1 according to the phase difference signal P-i.

In the phase difference signal creation unit 40-*i* illustrated in FIG. 6, the phase comparison unit 45-*i* outputs a positive or negative signal according to the result of phase comparison between the first detection signal D1-*i* and the output signal from the delay unit 44-*i*. For example, when the phase of the output signal from the delay unit 44-*i* advances with respect the phase of the first detection signal D1-*i*, the phase comparison unit 45-*i* outputs a positive signal. In the reverse case, the phase comparison unit 45-*i* outputs a negative signal. When the value of the phase difference signal P-i is increased in the positive direction, the delay unit 44-*i* increases the amount of delay. In the reverse case, the delay unit 44-*i* decreases the amount of delay. Thus, the value of the phase difference signal P-i matches the phase difference between the first detection signal D1-*i* and the sine wave signal Ds1.

In the embodiment described above, the number of detection electrodes is 2. In another example of this embodiment, however, the number of detection electrodes may be 3 or more.

In the embodiment described above, the first detection signal creation unit has as many charge amplifiers as there are detection electrodes. In another example of this embodiment, however, the number of charge amplifiers in the first detection signal creation unit may be made smaller than the number of electrodes by a selector circuit to select a connection between a charge amplifier and one of a plurality of detection electrodes.

The input device in this embodiment is not limited to a user interface device into which information based on a manipulation by a finger or like is entered. That is, the input device in this embodiment can be widely applied to devices that detect a capacitance between a detection electrode and any of various other objects not limited to the human body.

What is claimed is:

1. A capacitance detection device configured to detect a capacitance between a target and a detection electrode placed close to a shield electrode, the device comprising:
    an alternating-current voltage output unit configured to output an alternating-current voltage to the shield electrodes through a plurality of first wires;
    a first detection signal creation unit configured to have a plurality of detection nodes connected to a plurality of detection electrodes in one-to-one correspondence through a plurality of second wires, each of which is placed close to one of the plurality of first wires, to supply charge from a detection node, the detection node being one of the plurality of detection nodes, through a second wire, the second wire being one of the plurality of second wires, to a detection electrode, the detection electrode being one of the plurality of detection electrodes so that a voltage at the detection electrode vibrates according to the alternating-current voltage, and to create a plurality of first detection signals matching the charge supplied from the plurality of detection nodes;
    an alternating-current output node from which the alternating-current voltage output unit outputs the alternating-current voltage;
    a plurality of first paths, each of which branches from the alternating-current output node to one of the plurality of first wires;
    a plurality of first filters disposed in the plurality of first paths; and
    at least one phase difference signal creation unit configured to create a phase difference signal matching a phase difference between the alternating-current voltage and a first detection signal, the first detection signal being one of the plurality of first detection signals.

2. The capacitance detection device according to claim 1, wherein a first filter, the first filter being one of the plurality of first filters, is a low-pass filter having a cutoff frequency higher than a frequency of the alternating-current voltage.

3. The capacitance detection device according to claim 2, further comprising:
a plurality of second paths disposed between the plurality of second wires and the plurality of detection nodes; and
a plurality of second filters disposed in the plurality of second paths; wherein
a second filter, the second filter being one of the plurality of second filters, is a low-pass filter having a cutoff frequency higher than the frequency of the alternating-current voltage.

4. The capacitance detection device according to claim 3, further comprising:
a sine wave generation unit configured to generate a sine wave signal; and
at least one second detection signal creation unit configured to create a second detection signal matching an amplitude of an alternating-current component included in the first detection signal; wherein
the alternating-current voltage output unit is configured to output the alternating-current voltage matching the sine wave signal,
the at least one second detection signal creation unit includes
a first multiplication unit configured to multiply the sine wave signal and the first detection signal together, and
a first low-pass filter configured to attenuate a high-frequency component of an output signal from the first multiplication unit,
the at least one phase difference signal creation unit includes
a first delay unit configured to delay a phase of the sine wave signal by 90 degrees,
a second multiplication unit configured to multiply the first detection signal and the sine wave signal delayed by the first delay unit together, and
a second low-pass filter configured to attenuate a high-frequency component of an output signal from the second multiplication unit,
the at least one second detection signal creation unit is configured to create the second detection signal matching an output signal from the first low-pass filter, and
the at least one phase difference signal creation unit is configured to create the phase difference signal matching an output signal from the second low-pass filter.

5. The capacitance detection device according to claim 4, further comprising a second delay unit configured to delay the sine wave signal, wherein:
the alternating-current voltage output unit is configured to output the alternating-current voltage matching the sine wave signal delayed by the second delay unit; and
an amount of delay by the second delay unit has been adjusted so that the output signal from the second low-pass filter is minimized.

6. The capacitance detection device according to claim 4, wherein the first detection signal creation unit includes:
at least one charge amplifier configured to supply the charge to the detection electrode so that the voltage at the detection electrode vibrates according to the alternating-current voltage;
at least one differential amplifier configured to output a signal matching a difference between the alternating-current voltage and an output signal from the at least one charge amplifier; and
at least one analog-to-digital conversion unit configured to convert an output signal from the at least one differential amplifier to a digital signal and output the digital signal as the first detection signal.

7. The capacitance detection device according to claim 4, wherein:
the alternating-current voltage output unit, the first detection signal creation unit, the at least one second detection signal creation unit, the at least one phase difference signal creation unit, and the sine wave generation unit are provided in one or more integrated circuits; and
the first filter and the second filter are each composed of one or more parts different from the one or more integrated circuits.

8. The capacitance detection device according to claim 3, wherein:
the first filter includes
a first inductor disposed in a first path, the first path being one of the plurality of first paths, and
two first capacitors, each of which is disposed between ground and one of nodes at both ends of the first inductor; and
the second filter includes
a second inductor disposed in a second path, the second path being one of the plurality of second paths, and
two second capacitors, each of which is disposed between the ground and one of nodes at both ends of the second inductor.

9. The capacitance detection device according to claim 3, wherein:
the first filter includes
a first resistor disposed in a first path, the first path being one of the plurality of first paths, and
two first capacitors, each of which is disposed between ground and one of nodes at both ends of the first resistor; and
the second filter includes
a second resistor disposed in a second path, the second path being one of the plurality of second paths, and
two second capacitors, each of which is disposed between the ground and one of nodes at both ends of the second resistor.

10. The capacitance detection device according to claim 1, wherein:
the alternating-current voltage output unit, the first detection signal creation unit, the plurality of first filters, and the at least one phase difference signal creation unit are provided on a single first wiring board;
the shield electrode and the plurality of detection electrodes are provided on one or more second wiring boards;
the first wiring board and the one or more second wiring boards are connected together through one or more wiring cables; and
the first wire and the second wire are included in the wiring cable.

11. The capacitance detection device according to claim 1, wherein the alternating-current voltage output unit is configured to output the alternating-current voltage in which a direct-current voltage having an amplitude larger than a half of an amplitude of the alternating-current voltage is superimposed.

12. An input device configured to accept information matching an approach of a target, the device comprising:
- a plurality of detection electrodes, a capacitance between the target and the plurality of detection electrodes changing according to the approach of the target;
- a shield electrode placed close to the plurality of detection electrodes; and
- the capacitance detection device according to claim 1, the device detecting the capacitance between the target and each of the plurality of detection electrodes.

13. A capacitance detection device configured to detect a capacitance between a detection electrode and a target, the device comprising:
- a first detection signal creation unit configured to supply charge to the detection electrode and create a plurality of first detection signals matching the charge supplied to the detection electrode;
- a second signal creation unit configured to create an in-phase response from a first detection signal, the first detection signal being one of the plurality of first detection signals; and
- a phase difference signal creation unit configured to create a quadrature-phase response from the first detection signal; wherein
- a defect and a capacitance between the detection electrode and the target are detected according to the in-phase response and the quadrature-phase response.

14. A capacitance detection device configured to detect a capacitance between a target and a detection electrode placed close to a shield electrode, the device comprising:
- an alternating-current voltage output unit configured to output an alternating-current voltage to the shield electrode through a plurality of first wires;
- a first detection signal creation unit configured to have a plurality of detection nodes connected to a plurality of detection electrodes in one-to-one correspondence through a plurality of second wires, each of which is placed close to one of the plurality of first wires, to supply charge from a detection node, the detection node being one of the plurality of detection nodes, through a second wire, the second wire being one of the plurality of second wires, to a detection electrode, the detection electrode being one of the plurality of detection electrodes so that a voltage at the detection electrode vibrates according to the alternating-current voltage, and to create a plurality of first detection signals matching the charge supplied from the plurality of detection nodes;
- a second signal creation unit configured to create an in-phase response from a first detection signal, the first detection signal being one of the plurality of first detection signals; and
- a phase difference signal creation unit configured to create a quadrature-phase response from the first detection signal; wherein
- breakage of a first wire, the first wire being one of the plurality of first wires, and a capacitance between the detection electrode and the target are detected according to the in-phase response and the quadrature-phase response.

* * * * *